US011528025B2

(12) United States Patent
Illing et al.

(10) Patent No.: US 11,528,025 B2
(45) Date of Patent: Dec. 13, 2022

(54) DRIVER CIRCUIT, SYSTEM HAVING A DRIVER CIRCUIT, AND CALIBRATION METHOD

(71) Applicant: Infineon Technologies AG, Neubiberg (DE)

(72) Inventors: Robert Illing, Finkenstein (AT); Christian Djelassi-Tscheck, Villach (AT); Christof Glanzer, Villach (AT)

(73) Assignee: Infineon Technologies AG, Neubiberg (DE)

( * ) Notice: Subject to any disclaimer, the term of this patent is extended or adjusted under 35 U.S.C. 154(b) by 61 days.

(21) Appl. No.: 17/078,513

(22) Filed: Oct. 23, 2020

(65) Prior Publication Data
US 2021/0126632 A1   Apr. 29, 2021

(30) Foreign Application Priority Data
Oct. 25, 2019  (DE) .......................... 102019128849.5

(51) Int. Cl.
*H03K 17/687*   (2006.01)

(52) U.S. Cl.
CPC .............................. *H03K 17/6871* (2013.01)

(58) Field of Classification Search
CPC ................................................. H03K 17/6871
See application file for complete search history.

(56) References Cited

U.S. PATENT DOCUMENTS

| 5,828,247 A * | 10/1998 | Moller .................. H03K 17/18 327/388 |
| 8,008,953 B1 | 8/2011 | Brumett, Jr. et al. |
| 2008/0191779 A1 | 8/2008 | Heppenstall |
| 2012/0249103 A1 | 10/2012 | Latham, II et al. |
| 2017/0294772 A1* | 10/2017 | Llling .................. H02H 9/025 |

FOREIGN PATENT DOCUMENTS

| DE | 102012209188 A1 | 12/2012 |
| WO | 2019001925 A1 | 1/2019 |

* cited by examiner

*Primary Examiner* — Metasebia T Retebo
(74) *Attorney, Agent, or Firm* — Slater Matsil, LLP

(57) ABSTRACT

A driver circuit is provided. The driver circuit comprises a power transistor and a gate driver circuit arrangement. The driver circuit is integrated in a package. In addition, the driver circuit comprises a terminal for an external transistor. The external transistor and the power transistor are controlled by the gate driver circuit arrangement in a mutually corresponding manner.

20 Claims, 13 Drawing Sheets

DRIVER CIRCUIT, SYSTEM HAVING A DRIVER CIRCUIT, AND CALIBRATION METHOD

This application claims the benefit of German Application No. 102019128849.5, filed on Oct. 25, 2019, which application is hereby incorporated herein by reference in its entirety.

TECHNICAL FIELD

This application relates to driver circuits, systems having such driver circuits, and methods for calibrating driver circuits.

BACKGROUND

Driver circuits are used to drive transistors, such as power transistors. Such power transistors are used in various applications for switching high currents and/or high voltages. Such driver circuits usually contain a gate driver for controlling a gate terminal of the transistor, as well as various diagnostic functions and safety functions. In a driver circuit for controlling external transistors, i.e. transistors outside of the driver circuit, the external transistor is activated via a corresponding pin of the driver circuit. This pin can also be used to connect multiple transistors that are activated simultaneously.

To measure a current through the external transistor or through the external transistors, an external measuring resistor is conventionally used, which is connected in series with the external transistor. The current is then measured via a voltage drop across the resistor. In the event of an overcurrent, the external transistor or transistors is/are switched off. Such an external resistor incurs additional costs and requires corresponding pins on the driver circuit to supply the sampled voltage to the driver circuit.

SUMMARY

According to one exemplary embodiment, a driver circuit is provided that includes a gate driver circuit arrangement, a power transistor coupled with the gate driver circuit arrangement, and at least one terminal coupled with the gate driver circuit arrangement. The driver circuit is integrated in a package. The gate driver circuit arrangement is configured to control the power transistor and at least one transistor, external to the driver circuit and connected to the at least one terminal, in correspondence with each other.

According to another exemplary embodiment, a system having such a driver circuit and the at least one external transistor, which is coupled to the at least one output, is provided.

Finally, a method for calibrating such a driver circuit is provided, which comprises: providing calibration data for the external transistor, and storing the calibration data in the driver circuit.

The calibration data can specify parameters of the external transistor.

The above summary serves only as a brief overview of some exemplary embodiments and should not be interpreted as limiting, as other exemplary embodiments may have different features to those mentioned above.

DETAILED DESCRIPTION OF ILLUSTRATIVE EMBODIMENTS

In the following text, different exemplary embodiments are described in more detail by reference to the drawings. These exemplary embodiments are intended as examples only and should not be construed as limiting. For example, in other exemplary embodiments, some of the features or components represented or described may be omitted or replaced by alternative features and components. In addition to the explicitly described features and components, other features or components, such as features and components that are also used in conventional driver circuits and related systems, may be provided.

Features of different exemplary embodiments can be combined. For example, variations or modifications described for one of the exemplary embodiments can also be applied to other exemplary embodiments and are therefore not explained repeatedly.

To simplify the description and for better understanding, corresponding components or elements in different figures have the same reference sign and are not explained repeatedly.

Figure 1:
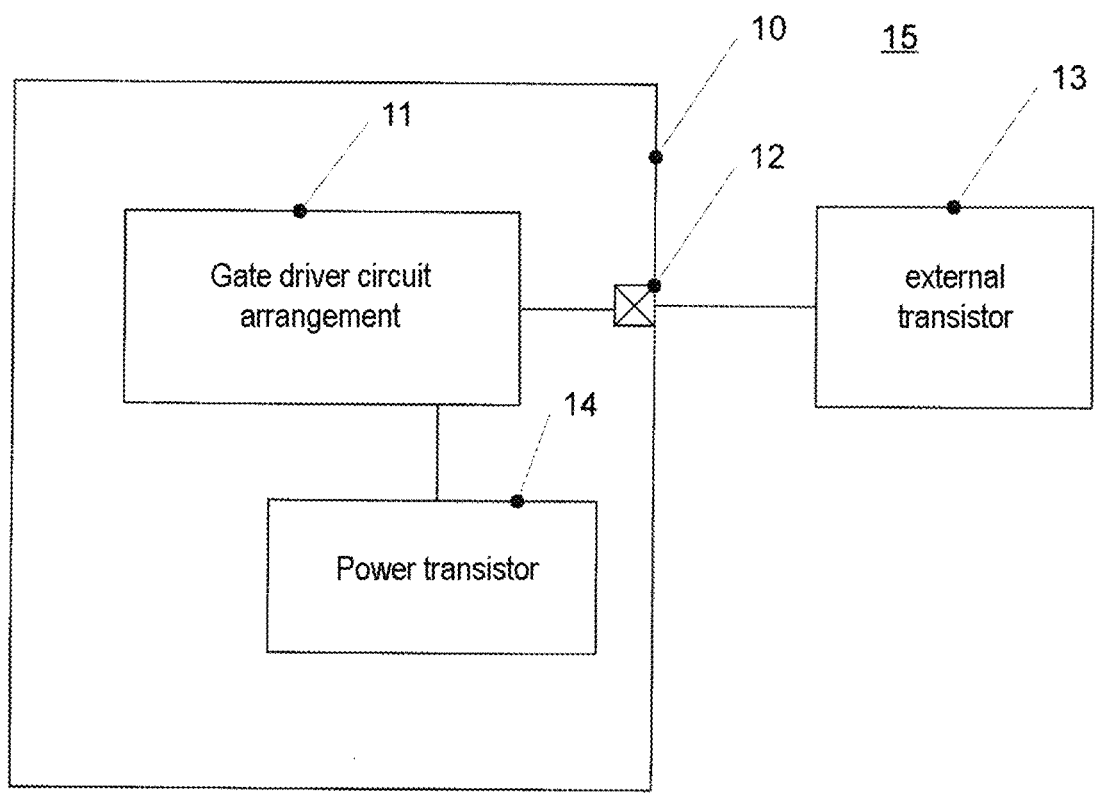
FIG. 1 shows a block diagram of a system in accordance with one exemplary embodiment.

FIG. 1 shows a block diagram of a system 15 in accordance with one exemplary embodiment. The system 15 has a driver circuit 10. The driver circuit 10 comprises a gate driver circuit arrangement 11, a power transistor 14 and a terminal 12. A terminal in this sense is an element of the driver circuit 10 with which elements that are external to the driver circuit 10 can communicate with the driver circuit 10. In the case of the system 15, an external transistor 13 is connected to the terminal 12 to communicate with the driver circuit 10.

The driver circuit 10 is integrated in a single package. The terminal 12 is then a pin, pad or similar terminal of said package, depending on the implementation and type of package. The components of the driver circuit 10, in particular the gate driver circuit arrangement n and the power transistor 14 can be monolithically integrated on a single chip. In other exemplary embodiments, components of the driver circuit 10 can also be implemented on separate chips, which are then arranged together in a package.

The gate driver circuit arrangement 11 drives both the power transistor 14 and the external transistor 13 to control the power transistor 14 and the external transistor 13, for example, to switch them on and off. The activation is mutually corresponding, i.e. the external transistor 13 and the power transistor 14 are switched together so that they have the same switching behavior, for example, they are switched on and off simultaneously. This applies within limits, which may be due, for example, to different signal propagation times from the gate driver circuit arrangement 11 to the external transistor 13 and the power transistor 14, which may be caused by differences in the implementation between the external transistor 13 and the power transistor 14 and/or may be due to other tolerances or fluctuations.

The external transistor 13 can also be a power transistor. A power transistor is understood to mean a transistor that can be designed to switch high voltages and/or high currents. A power transistor may have a size greater than 0.5 mm² on a chip to be able to conduct such large currents, and may have sizes of >10 mm². A resistance Ron in the on state can be in the range of 20 mΩ/mm², and the total resistance Ron can be less than 100 mΩ. For example, power transistors can conduct currents of greater than 10 A, for example in ranges up to 40 A, and/or switch voltages greater than 10 V, for example several 100 V.

Note that FIG. 1 shows only some of the possible components of a system 15. Thus, multiple external transistors can be used instead of a single external transistor. In addition, the driver circuit 10 can have diagnostic and/or measurement functions. In some exemplary embodiments, a measurement can be performed on the power transistor 14, for example, measurement of a current through the power transistor 14, and based on this a current through the external transistor 13 can be derived. Examples of this will now be explained in detail with reference to further figures.

Figure 2A:
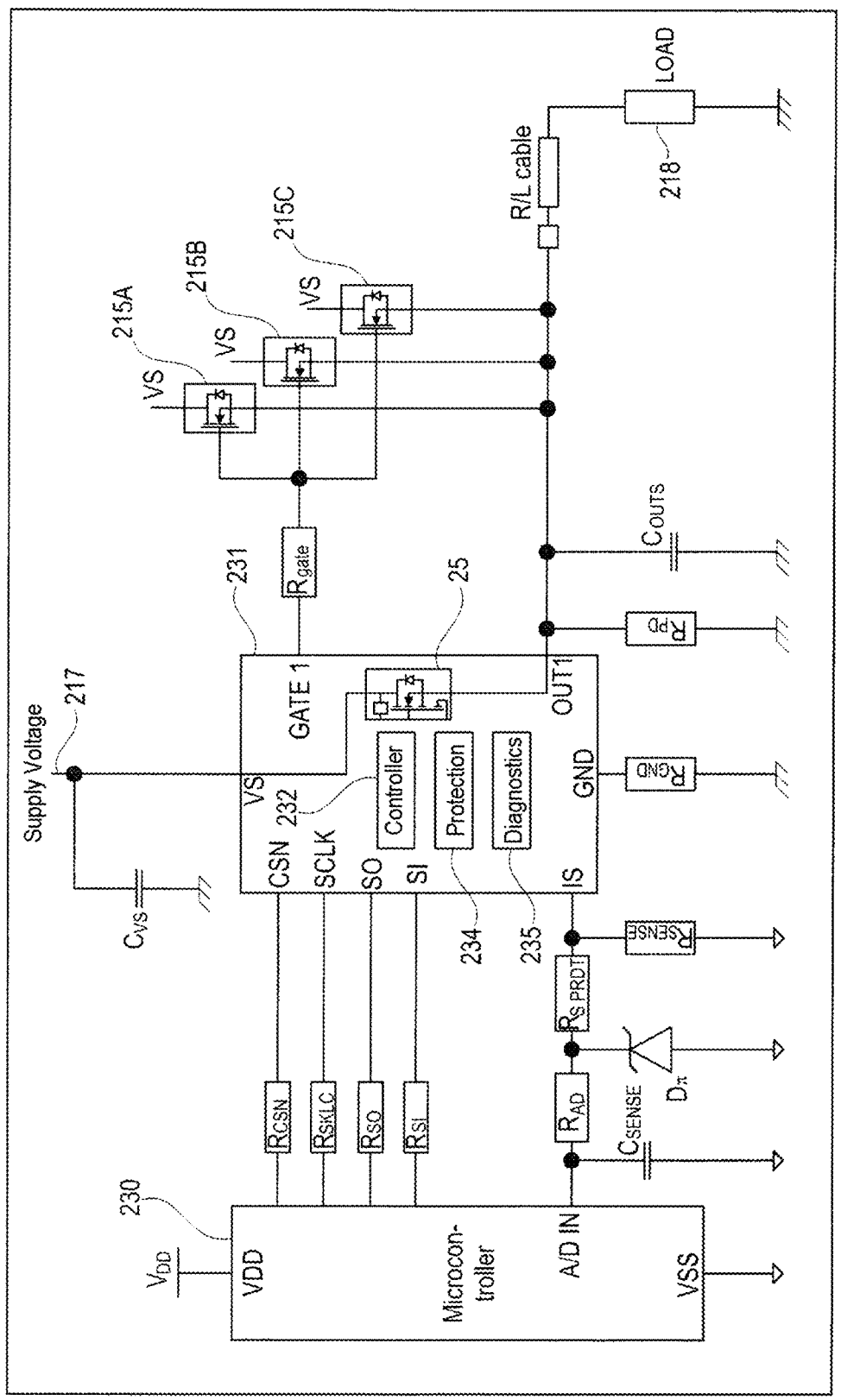
FIG. 2A shows a block diagram of a system in accordance with one exemplary embodiment.

FIG. 2A shows a block diagram of a system in accordance with one exemplary embodiment. The system of FIG. 2A comprises a driver circuit 231. The driver circuit 231 has an internal power transistor 25. The power transistor 25 can be, for example, a DMOS transistor. In addition, the driver circuit 231 has control functions 232, safety functions 234 and diagnostic functions 235. The control functions 232 are used in particular for driving the power transistor 25 and for driving external transistors that are controlled by the driver circuit 231. As an example, three external transistors 215A, 215B, 215C are shown in FIG. 2A, which are controlled via a single terminal GATE1 of the driver circuit 231 via a gate resistor. The external transistors 215A, 215B and 215C are collectively referred to hereafter as external transistors 215. The number of three external transistors 215 should only be understood as an illustrative example, and there may also be fewer external transistors 215 provided, for example one or two external transistors 215, or more than three external transistors 215.

The external transistors 215 are connected in parallel with the power transistor 25 between a positive supply voltage 217 and a load 218 in order to couple the load 218 optionally with the positive supply voltage 217.

The driver circuit 231 is controlled by a microcontroller 230. This can exchange various control and diagnostic signals with the driver circuit 231. Examples of this will be explained in detail later with reference to FIG. 2B. The driver circuit 231 controls the power transistor 25 and the external transistors 215 in a mutually corresponding manner, so that they exhibit essentially the same switching behavior.

In addition, in the exemplary embodiment of FIG. 2A, the external transistors 215 and the power transistor 25 have similar parameters, such as resistance in the on state, breakdown voltage, cutoff voltage, steepness, overcurrent resistance and the like. This allows the protective functions 234 and diagnostic functions 235 to derive information about currents, voltages and the like on the external transistors 215 by measuring currents, voltages etc. on the power transistor 25 without the need, for example, for an external measuring resistor for measuring a current through the external transistors 215. This is also explained in more detail later. A result of a current measurement of a current through the power transistor 25 can, as also explained in detail later, be output from the driver circuit 231 at an output IS and fed to an analog/digital converter input of the microcontroller 230.

The external wiring of the driver circuit 231 can be implemented as shown in FIG. 2A.

Figure 2B:
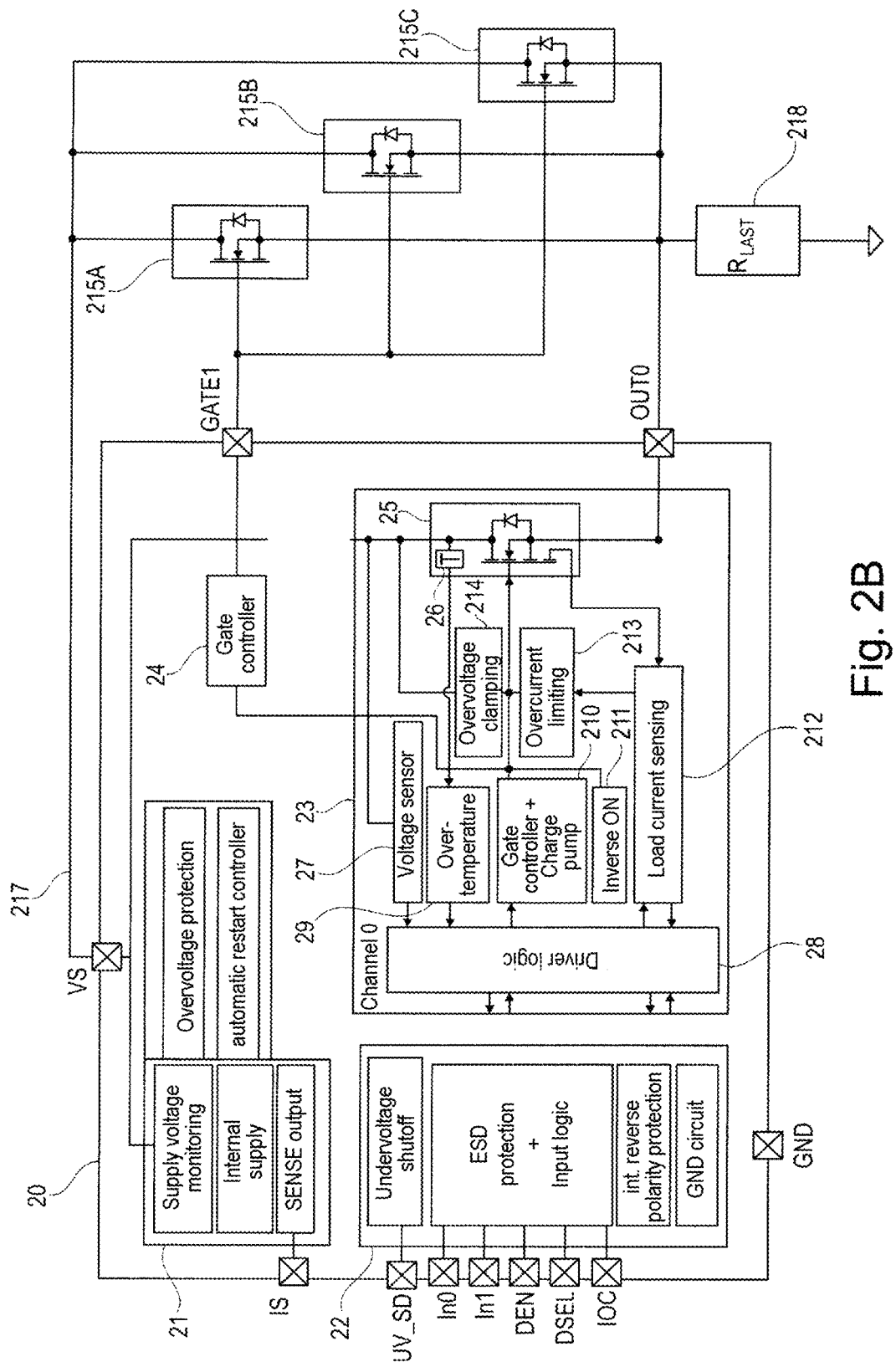
FIG. 2B shows a detailed block diagram of a system in accordance with one exemplary embodiment.

Possible details of such a driver circuit 231 will now be explained in more detail with reference to FIG. 2B. FIG. 2B shows a detailed block diagram of a system in accordance with one exemplary embodiment. A driver circuit 20 of FIG. 2B can be considered an implementation example for the driver circuit 231 of FIG. 2A.

The system of FIG. 2B comprises a driver circuit 20 and one or more external transistors 215, in the example shown three external transistors 215A, 215B, 215C. The number of three external transistors is purely intended as an example, and a different number of external transistors can also be provided, depending on the implementation.

In the exemplary embodiment shown, the external transistors 215 are power transistors that are implemented as MOSFETs.

Like the driver circuit 10 of FIG. 1, the driver circuit 20 is integrated in a package and can also be monolithically integrated in a single chip or else provided on a plurality of chips within the package. The driver circuit 20 has a terminal GATE1, which is coupled with gate terminals of the transistors 215.

The driver circuit 20 in turn has the power transistor 25, which is also implemented as a MOSFET. In the exemplary embodiment of FIG. 2B, the power transistor 25 and the external transistors 215 have similar parameters. For example, they can be implemented nominally equal with regard to their dimensioning and design, so that differences in parameters can only occur due to process fluctuations, manufacturing tolerances, and the like. Similar parameters in this context means that parameters such as cutoff voltage, breakdown voltage, gradient and resistance Ron in the on state are approximately equal, i.e. they differ by a maximum of 10%, for example, a maximum of 5% or a maximum of 1%. In other exemplary embodiments, the transistors 215 can be dimensioned differently to the power transistor 25 of the driver circuit 20. Such cases will be explained in more detail later.

In the exemplary embodiment shown, the power transistor 25 and the external transistors 215 are connected with their drain-source paths in parallel between the positive supply voltage 217 and the load 218 in order optionally to supply the load 218 with electrical power. For this purpose, the power transistor 25 and the external transistors 215 are controlled in a corresponding manner, in particular switched on and off together, so that the power transistor 25 and the external transistors 215 are opened together to disconnect the load 218 from the positive supply voltage 217, or closed together to connect the load 218 to the positive supply voltage 217 to supply power to the load 218.

For this purpose, the supply voltage 217 of the driver circuit 20 is fed in at a terminal VS. The terminal VS is connected to a drain terminal of the power transistor 25 as shown. A source terminal of the power transistor 25 is connected to a terminal AUS0 of the driver circuit 20. The load 218 is connected to source terminals of the transistors 215 and to the terminal OUT0, as shown in FIG. 2B.

The terminal VS is additionally connected to a circuit block 21. The circuit block 21 has a supply voltage monitoring unit which monitors whether the supply voltage 217 is within an acceptable range. In addition, the circuit block 21 has an overvoltage protection, which acts as a protective mechanism in the event of excessive voltages. In the event of a momentary failure of the voltage 217, an automatic restart control can also be provided. In addition, an internal supply voltage is generated in block 21 from the supply voltage 217 and supplies different components of the driver circuit 20 with electrical power. Finally, a sense output IS is operated via the circuit block 21, at which a detected current can be output, as described later. The circuit block 21 can be designed as in conventional driver circuits and also comprise components other than those shown.

A circuit block 22 is connected to terminals UV_SD, IN0, IN1, DEN, DSEL, IOC, via which the driver circuit 20 can communicate with an external component such as a microcontroller. Via the terminal UV_SD the circuit block 22 can initiate a shutdown in the event of an undervoltage condition. The terminals IN0, IN1, DEN, DSEL are used for operation and diagnostics and are initially connected to a protective circuit for protection against electrostatic discharges (ESD protection) and an input logic, which converts levels at the terminals to internal levels and/or has signals at the terminals. In addition, the circuit block 22 is connected to ground via a terminal GND, and a corresponding circuit part (GND circuit) processes and connects the ground within the driver circuit 20.

In addition, the circuit block 22 has a polarity reversal protection, which protects the driver circuit 20 if the positive supply voltage 217 and ground are connected the wrong way around, i.e. the positive supply voltage to the terminal GND and the ground to the terminal VS. Such a protection is also known as reverse polarity protection. The circuit block 22 can also be designed as in conventional driver circuits.

Signals at the IN0, IN1, DEN, DSEL terminals can be supplied by an external microcontroller, for example, to control and monitor the switching of the power transistor 25 and the external transistors 215. In this case a signal at terminal IN0 is used to control the power transistor 25 and the external transistors 215A to 215C. These form a first channel, designated as Kanal0 in FIG. 2B. In some exemplary embodiments, another channel may be provided having another power transistor within the driver circuit 20 and additional external transistors, coupled via an additional terminal GATE1, and controlled using a signal on the IN1 terminal. This is not explicitly shown in FIG. 1 and can be configured in the same way as the first channel (Kanal0) described below. In other exemplary embodiments, only a single channel is present or else more than two channels are present. Diagnostic functions can be triggered via signals at the terminals DEN and DSEL, wherein a signal at the terminal DEN activates the diagnostics and a signal at the terminal DSEL selects a channel for the diagnostics.

Diagnostics and monitoring in addition to control for the first channel are carried out in a circuit block 23, which comprises the power transistor 25. This circuit block 23 is described in more detail below. The controller is described first before discussing various diagnostic options.

To control the power transistor 25 and the transistors 215, the signal from terminal IN0 is fed to a driver logic 28, which controls a gate controller with charge pump 210 according to the signal, and the charge pump 210 generates a corresponding voltage for controlling transistors 25 and 215. In the exemplary embodiment shown, an output signal from the gate controller and charge pump 210 is fed to a gate terminal of the power transistor 25. In addition, the signal is fed via a gate controller 24 and the terminal GATE1 to gate terminals of the external transistors 215. In this way, the power transistor 25 and the external transistors 215 are controlled in a corresponding manner. The gate controller 24 in some exemplary embodiments can optionally decouple the signal from the gate controller and charge pump 210 from the terminal GATE1, so that operation without external transistors 215 is also possible, and/or can amplify, buffer, or alter the levels of the signal to match it to the transistors 215, in case their voltage requirements differ from the voltage requirements of the power transistor 25. Details of such circuits will be explained in more detail later. In addition, the gate controller 24 can provide protection against electrostatic discharge (ESD) for the GATE1 terminal.

Next, the diagnostic and protection functions of circuit block 23 are described.

For the diagnostics a load current sensing 212 is provided, which is designed to detect a current through the power transistor (i.e., a drain-source current or, in other words, a current flowing from the positive supply voltage 217 via the power transistor 25 to the load 218. This detected current can be forwarded via the driver logic and output, for example, at the output IS, in particular if a corresponding diagnostic request is present at the terminal DEN. The load current can also be monitored by an overcurrent limiter 213, which in the event of an overcurrent, i.e. a current that is above a specified threshold value, switches off the transistor 25 and, via the gate controller 24, the external transistors 215. In some exemplary embodiments this can prevent damage to the power transistor 25 and the external transistors 215 due to excessive current.

The exemplary embodiment of FIG. 2B exploits the fact that the external transistors 215 have similar parameters to the power transistor 25, as explained above. Thus, in the on state, approximately equal currents will flow through each of the external transistors 215 and the power transistor 25. Therefore, in this case, an overcurrent on the power transistor 25 means that an overcurrent also exists on the external transistors 215, simply because the transistors have roughly equal parameters, including their overcurrent behavior. Thus, in the exemplary embodiment of FIG. 2B, no external measuring resistor or other external measuring device is required to monitor currents through the external transistors 215, but this can be carried out by measuring the current through the power transistor 25.

For load current sensing 212 any conventional circuits can be used for current sensing, for example an internal measuring resistor within the driver circuit 20, or a measuring transistor. The use of a measuring transistor will be explained in more detail later.

If the total current is required for diagnostic functions, the total current through the load then corresponds to the detected current through the power transistor multiplied by the total number of transistors, i.e. in the example of FIG. 2B, multiplied by 4 (power transistor 25+three external transistors 215). This can also be used to provide an overcurrent monitoring for the load 218, since in this way the current through the load is also known.

Furthermore, in the exemplary embodiment of FIG. 2B, a temperature sensor 26 is assigned to the power transistor 25. An over-temperature detection 29 checks whether the temperature detected by the one temperature sensor 26 is above a threshold value. If this is the case, a warning can be issued and/or the power transistor 25 can be switched off together with the external transistors 215. Finally, a voltage sensor 27 is provided, which measures a voltage at the power transistor 25. In addition, a clamping device 214 is provided, which limits a drain source voltage to a maximum value in order to avoid avalanche breakdown. In the case of FIG. 2A, the clamping device acts for both the power transistor 25 and the external transistors 215. For example, the clamping device can be configured by means of a Zener diode either alone as a passive terminal device, or together with a transistor that is controlled by the Zener diode as an active terminal device (in the latter case also referred to as an "active Zener").

Finally, the driver circuit 20 comprises a circuit 211, which switches on the power transistor 25 and the external transistors 215 in the event of an inverse state. Such an inverse state occurs when a higher voltage is present at the terminal OUT0 than at the terminal VS. In this case, in standard power transistor implementations a body diode of the power transistor 25 and the external transistors 215 would become conducting, which can lead to relatively high power losses. By switching on the transistors, this power loss can be limited.

It should be noted that the various diagnostic functions can be implemented in existing known ways. However, only some of the diagnostic functions or other conventional diagnostic functions can be provided. In contrast to conventional approaches, the provision of the diagnostic functions primarily for the power transistor 25 also provides monitoring of external transistors 215.

Figure 3:
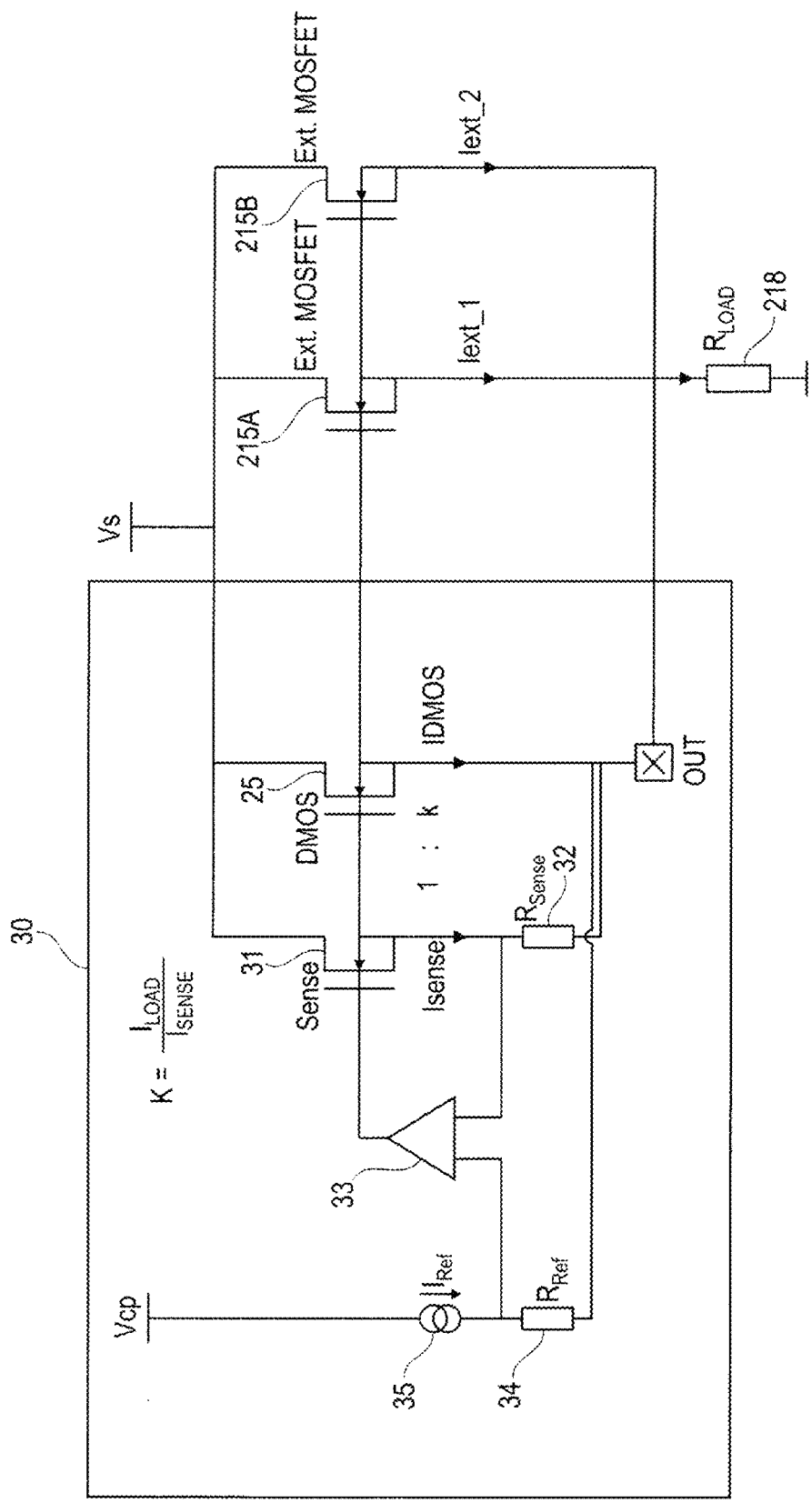
FIG. 3 shows a circuit diagram of a system in accordance with one exemplary embodiment.

An example of load current measurement and overcurrent detection will now be explained with reference to FIG. 3. FIG. 3 shows part of a driver circuit 30, in particular a current sensing and overcurrent detection, such as can be used in the driver circuits of FIGS. 1, 2A and 2B discussed above or in one of the driver circuits discussed below.

The driver circuit 30 comprises the power transistor 25 already discussed. Two additional external transistors 215, labeled 215A and 215B, are also shown as an example. The power transistor 25 and the external transistors 215 are connected in parallel between the supply voltage 217 already discussed and the load 218, also discussed above. In FIG. 3 it is again assumed that the external transistors 215 have similar parameters to the power transistor 25.

In addition, the driver circuit 30 has a sensing transistor 31, which is connected in parallel with the power transistor 25 and is scaled with respect to it. The sensing transistor 31 can be connected to the power transistor 25, in particular in a current mirror configuration. A scaling factor between the sensing transistor 31 and the power transistor 25 is denoted by k and is also referred to as the $k_{ILIS}$ factor.

The current through the load 218 consists of a current IDMOS through the power transistor 25, a current Iext_1 through the external transistor 215A and a current Iext_2 through the external transistor 215B. The current through the sensing transistor 31, Isense, is scaled with respect to the current through the power transistor 25 by the scaling factor k. The total current I through the load 218, Iload, is scaled with respect to the current Isense by a factor K, which is n*k, where n is the number of transistors (power transistor 25+external transistors), i.e. in the example of FIG. 3, 3*k. The current Isense flows via a resistor 32 to the terminal OUT. The resistor 32 is used as a measuring resistor for the current Isense. A corresponding voltage for this purpose is tapped at the resistor 32 and fed to a first input of a comparator 33.

Furthermore, a reference current source 35 generates a reference current Iref, which is measured by means of a measuring resistor 34. The voltage at the measuring resistor 34 is fed to a second input of the comparator.

If the current Isense exceeds the current Iref, based on an output of the comparator 33 the power transistor 25 and the external transistors 215 are opened, and in the example of FIG. 3 the sensing transistor 31 is also opened. In this way, an overcurrent protection can be implemented.

It should be noted that for current sensing alone and for an overcurrent monitoring, two separate sensing transistors can also be provided. A corresponding exemplary embodiment, in which further details of the current sensing and overcurrent monitoring are shown, is illustrated in FIG. 4.

Figure 4:
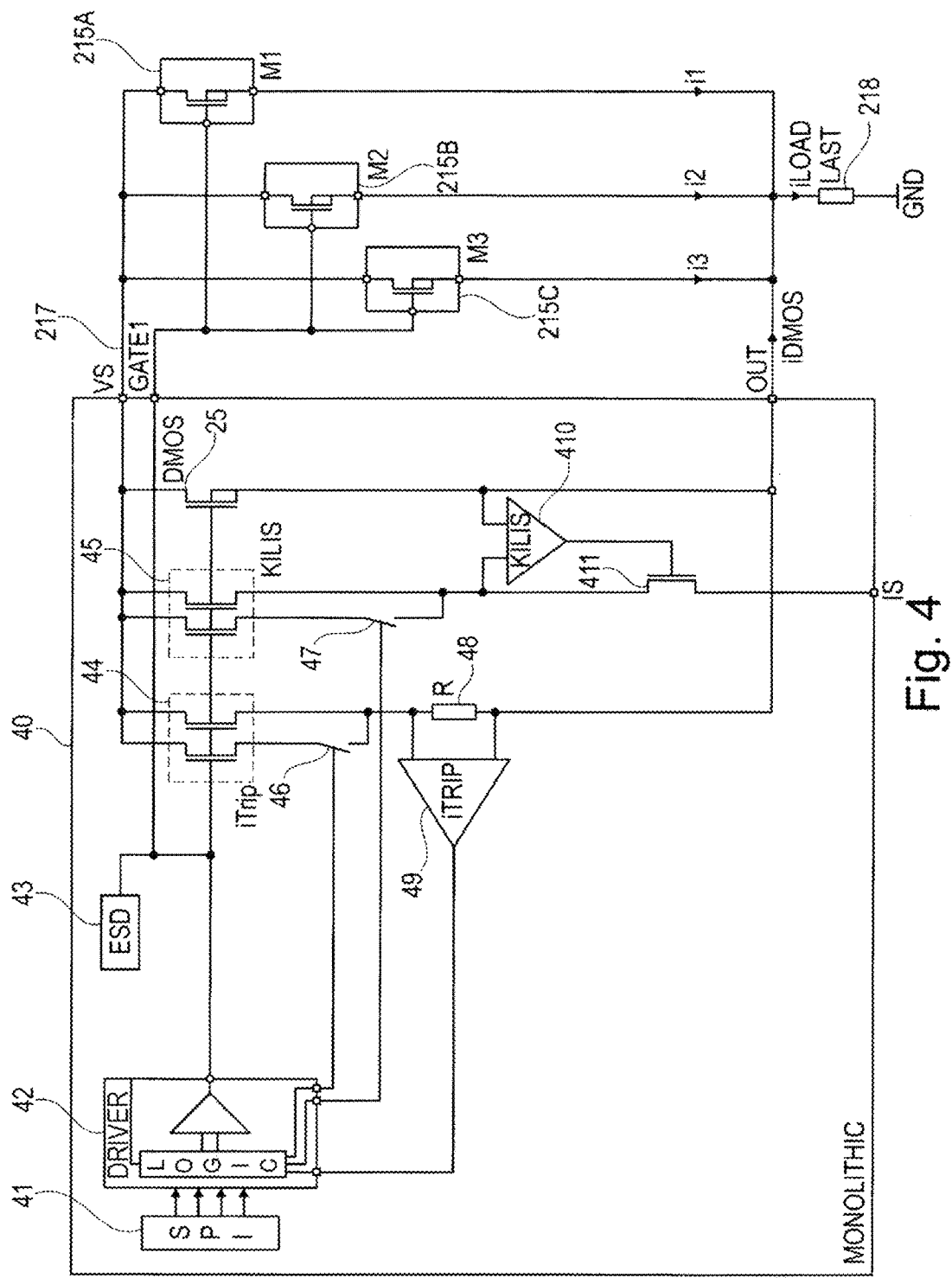
FIG. 4 shows a block circuit diagram of a system in accordance with one exemplary embodiment.

FIG. 4 shows a system in accordance with another exemplary embodiment. Based on the system of FIG. 4, a possible implementation of an overcurrent detection and a current measurement is explained in more detail below.

The system of FIG. 4 shows a driver circuit 40 with a gate driver 42 and a power transistor 25. As explained for the driver circuits described above, the driver circuit 40 is also arranged in a package, in particular integrated in a monolithic form in a single chip or distributed over multiple chips arranged within the package. The gate driver 42 drives the power transistor 25 and, via a terminal GATE1, one or more external transistors 215, of which three external transistors 215A to 215C are again shown. As with the exemplary embodiments described above, the power transistor 25 and the external transistors 215 are connected in parallel between a positive supply voltage 217 and a load 218 in order to supply them optionally with electrical power. The gate driver 42 has a power that is sufficient to drive the power transistor 25 and a number of external transistors for which the driver circuit 40 is designed, and in particular to ensure a sufficiently fast switching by appropriate rates of rise or fall of the respective gate-source voltages.

In the exemplary embodiment of FIG. 4, the driver circuit 40 has an ESD protection circuit 43 coupled with the GATE1 terminal.

The gate driver 42 contains a logic and can be controlled via an interface 41, for example an SPI (Serial Peripheral Interface), for example, by a microcontroller as shown in FIG. 2A. The driver circuit 40 also has a first sensing transistor arrangement 44 for overcurrent detection and a second sensing transistor arrangement 45 for current measurement. The sensing transistor arrangements 44 and 45 are each shown with two transistors, which, as already explained by reference to FIG. 3 for the sensing transistor 31, are scaled in comparison to the power transistor 25, in particular smaller in size.

In the exemplary embodiment of FIG. 4 a first sensing transistor of each sensing transistor arrangement 44, 45 is always active, and a second transistor can be connected in for the sensing transistor arrangement 44 via a switch 46 and for the sensing transistor arrangement 45 via a switch 47. In some exemplary embodiments, the switches 46, 47 can be closed if the external transistors 215 are connected to the terminal GATE0 of the driver circuit 40.

If no external transistors are connected, the switches can be opened. This changes the effective scaling ratio between the sensing transistor arrangements 44, 45 and the power transistor 25 and can be used to provide a current measurement that corresponds to the total current through the transistors 25, 215. Referring to FIG. 3, this means that by adding one or more transistors, k is effectively changed in such a way that the current resulting from K of FIG. 3 is determined by the sensing transistor arrangements 44 or 45.

Whether external transistors 215 are provided can be detected either by a circuit within the driver circuit, as will be explained in more detail later, or else communicated via the interface 41.

The sensing transistor arrangement 44 is used for overcurrent detection. For this purpose, a measuring resistor 48 is connected in series with the sensing transistor arrangement 44. The voltage across the measuring resistor 48, which is a measure of the current through the sensing transistor arrangement 44 and thus a measure of the current through the power transistor 25 and for the total current through the transistors 25, 215, is measured by a differential amplifier 49 and fed to the logic of the gate driver 42. The logic of the gate driver 42 can compare the value thus supplied with a threshold value and in the case of an overcurrent, i.e. when the measured current exceeds a threshold value.

The sensing transistor arrangement 45 is also used to provide a current measurement. A source terminal of the power transistor and a source terminal of the sensing transistor arrangement 45 are connected to a differential amplifier 410, the output of which is connected to a gate terminal of a transistor 411. The components 410, 411 regulate the source voltage of the sensing transistor arrangement 45 to the source voltage of the power transistor 25. Since the drain terminals are each connected to the supply voltage 217, this means that the voltage drop across the sensing transistor arrangement 45 is exactly the equal (within the bounds of the regulation accuracy) to the voltage drop across the power transistor 25, which in some exemplary embodiments can increase the accuracy of the current measurement. The transistor 411 is connected to an output IS of the driver circuit 40 as shown, so that in this case the current flowing through the sensing transistor arrangement 45 can be tapped off at the output IS. It should be noted that in the case of the sensing transistor arrangement 44 such components as 410, 411 are not necessary, since the drain terminals of the sensing transistor arrangement 44 and the power transistor 25 are also connected together here.

It should also be noted that in other exemplary embodiments the sensing transistor arrangement 45 can also be omitted, and the output of the differential amplifier 49 can also be output at an output such as the output IS as a measure of the current flowing.

Figure 5A:
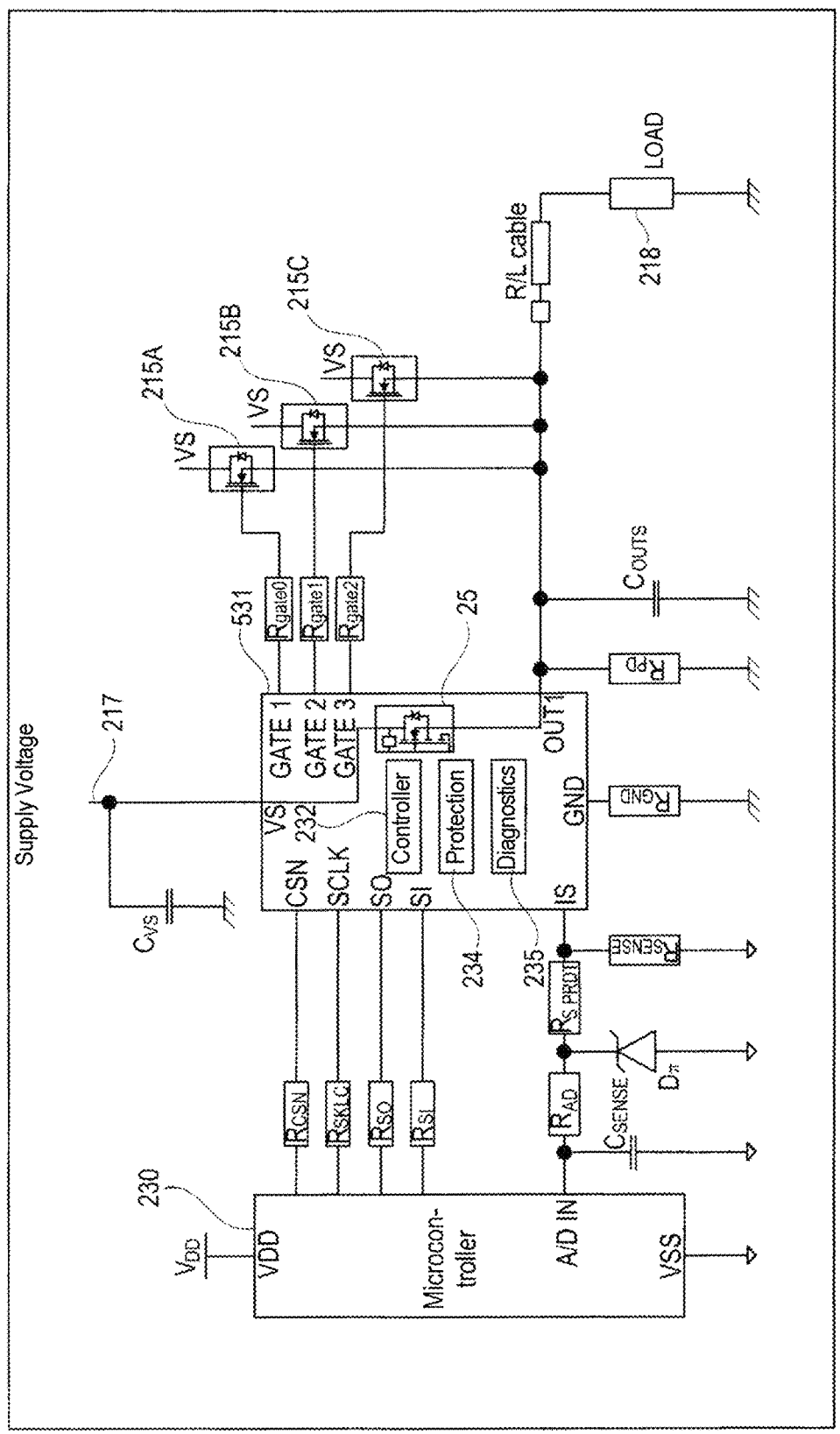
FIG. 5A shows a block diagram of a system in accordance with one exemplary embodiment.

In the exemplary embodiments discussed above, the respective driver circuits have a single terminal (GATE1) to which one or more external transistors are coupled. Other exemplary embodiments, which are explained in more detail below, have separate terminals for multiple external transistors. A first such exemplary embodiment is shown in FIG. 5A. Except for the changes explained below, the exemplary embodiment of FIG. 5A corresponds to the exemplary embodiment of FIG. 2A, and corresponding elements bear the same reference signs. Therefore, only the changes will be explained here.

Instead of the driver circuit 231 of FIG. 2A, the system of FIG. 5A has a driver circuit 531, which has three terminals GATE1, GATE2, GATE3. Each of the terminals GATE1, GATE2, GATE3 is connected to a respective external transistor 215A, 215B or 215C. The transistors 215 are controlled by the driver circuit 531 according to the activation of the power transistor 25, as already explained for the power transistor 25 and the external transistors 215 of FIG. 2. The provision of three terminals is again only intended as an example, and two or more terminals can also be provided to drive a corresponding number of external transistors 215.

In some implementations, the terminals GATE1, GATE2, and GATE3 can be optionally disabled. For example, it is possible to provide only the external transistor 215A, and the terminals GATE1 and GATE2 of the driver circuit 531 are disabled. The controller 232, especially the driver of the latter, then outputs only one control signal to the power transistor 25 and to the terminal GATE0 for driving the external transistor 215A. For this purpose, the driver circuit 531 can also be configured to automatically detect whether and to which of the terminals GATE1, GATE2 and GATE3 an external transistor is connected. This will be explained in more detail later.

Figure 5B:
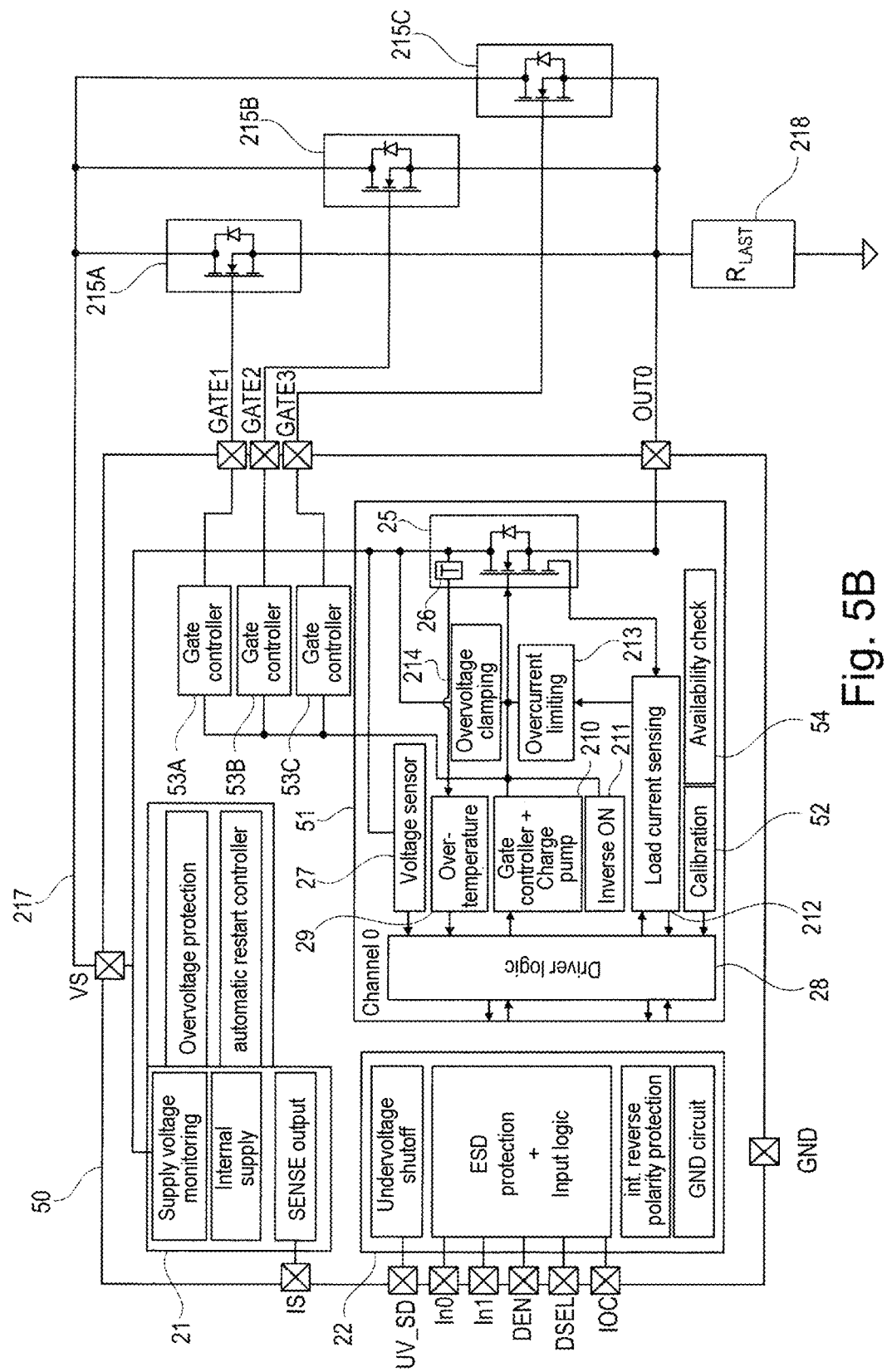
FIG. 5B shows a detailed block diagram of a system in accordance with one exemplary embodiment.

A more detailed block diagram is shown in FIG. 5B. The system of FIG. 5B is a variation of the system of FIG. 2B, and identical elements again bear the same reference signs and are not explained again here.

The system of FIG. 5B has a driver circuit 50. The differences relative to the driver circuit 20 of FIG. 2B will be explained below.

Similar to the driver circuit 531 of FIG. 5A, the driver circuit 50 of FIG. 5B has three separate gate terminals GATE1, GATE2 and GATE3, one of the transistors 215A, 215B, 215C being connected to each of the terminals. Each of the terminals GATE1, GATE2 and GATE3 is coupled with a corresponding gate controller 53A, 53B, 53C, which provides the functions of the gate controller 24 of FIG. 2B for each of the terminals GATE1, GATE2, GATE3 separately. The gate controllers 53A, 53B, 53C can be optionally deactivated, for example switched off, to optionally deactivate the terminals GATE1, GATE2, GATE3, and in each case—like the gate controller 24 of FIG. 2B—are controlled by the gate controller and charge pump 210.

Next, the differences between a circuit block 51 of the driver circuit 50 and the corresponding circuit block 23 of the driver circuit 20 of FIG. 2B will be discussed. In addition to the circuit block 23, the circuit block 51 comprises an availability checking circuit 54, which tests to which of the terminals GATE1, GATE2 and GATE3 an external transistor 215 is connected. Implementation examples of this will be explained later. Those of the terminals GATE1 to GATE3 to which no external transistor is connected can then be deactivated. In addition, the load current detection can be adapted accordingly, for example as explained by reference to FIG. 4 using the switches 46, 47.

The results of the availability check 54 can also be transmitted via terminals to another unit, such as the microcontroller 230 (see FIG. 5A), which can be used to influence various functions. For example, the absence of an external transistor 215, which should actually be present, may also indicate a defective transistor. In this case, for example, some functions in a system can be turned off. As an example, the load 218 may contain different loads in an automobile, some of which may be more important than others. If one of the external transistors 215 is detected as unavailable, less important functions, particularly non-safety-relevant functions such as a seat heater, can be switched off to limit a maximum current drawn through the load 218.

It should be noted that the availability check 54 can work when the system is being started up, but also during the operation of the system, for example to prevent failures. If some or all of the external transistors 215 are unavailable, a power of the gate controller and charge pump 210 can also be adjusted.

The provision of more than one external transistor 215 can also include redundancy. For example, only one of the external transistors 215 can be activated at any time, and if it turns out that one of the transistors is not available, another of the external transistors 215 is activated.

In addition, the circuit block 51 has a calibration memory 52. This calibration memory can be used if, in contrast to the exemplary embodiments discussed above, the external transistors 215 have no similar parameters to the power transistor 25. In this case, for example, current flow through each of the external transistors 215 may differ from the current flow through the power transistor 25, and/or breakdown and/or breakdown conditions or overcurrent conditions may differ. This different behavior can be stored in the calibration memory 52 and then taken into account by the driver logic. For example, from the ratio of the resistance in the conductive, switched-on state (usually referred to as Ron) of the external transistors 215 to the power transistor 215 from the current detected by means of the load current sensing 212, the current through the external transistors 215 can be derived, and in the event of an appropriate overcurrent, a shutdown can be initiated.

Some details of this calibration will be explained in more detail later with reference to FIG. 11.

Figure 6:
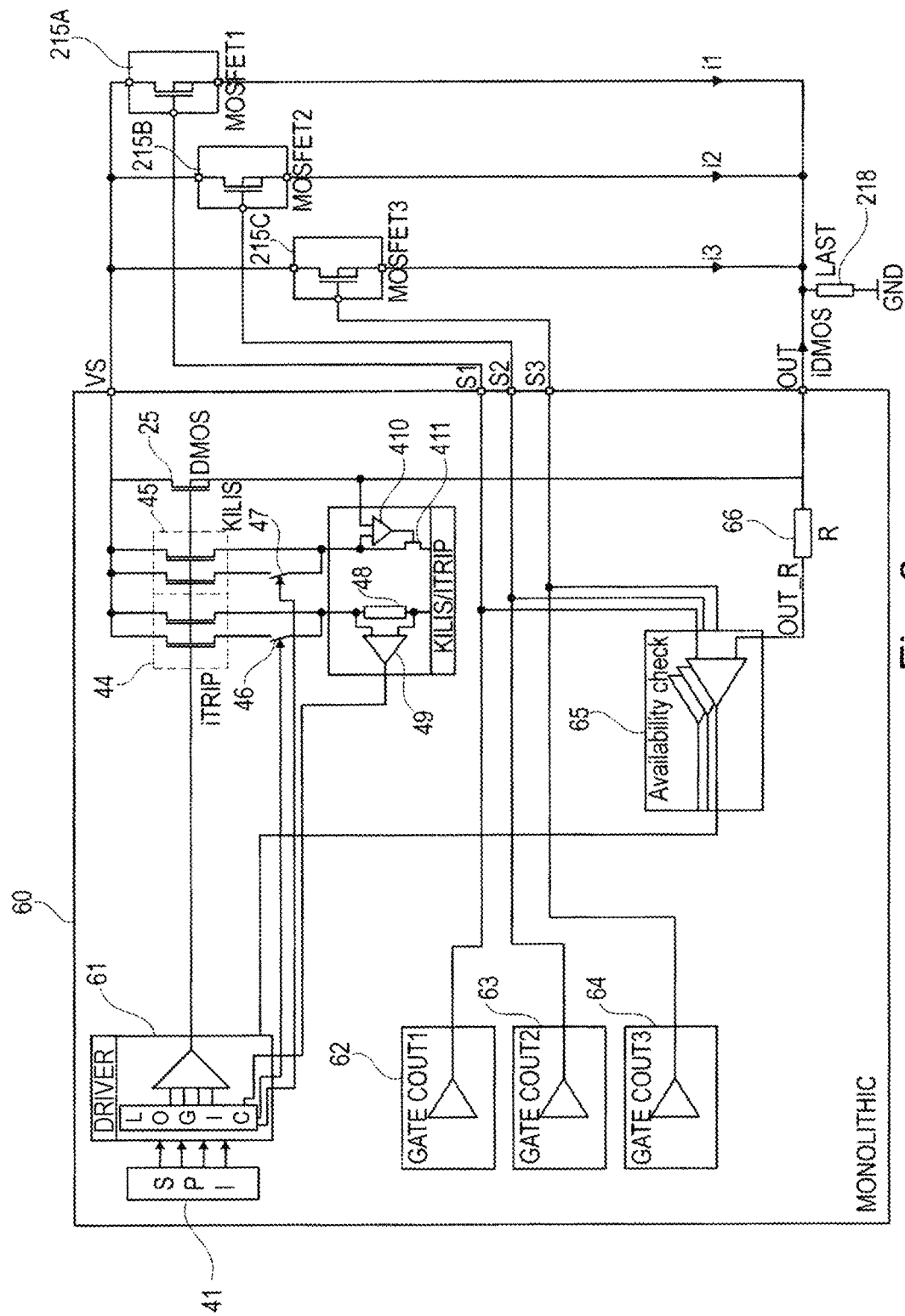
FIG. 6 shows a circuit diagram of a system in accordance with one exemplary embodiment.

FIG. 6 shows a circuit diagram of a system according to one exemplary embodiment, which shows possible implementation details of the systems of FIGS. 5A and 5B. The system of FIG. 6 has a driver circuit 60, with which the three external transistors 215A, 215B and 215C previously discussed are connected to three terminals GATE1, GATE2 and GATES, where the number of three external transistors is again used as an example. The driver circuit of FIG. 6 shows the sensing transistor arrangements 44, 45 previously discussed with reference to FIG. 4 with the corresponding wiring. In addition, the driver circuit has a driver 61 with a logic, which drives the sensing transistor arrangements 44, 45 and the power transistor 25. The driver 61 can be controlled via the interface 41 already described.

The driver 61 can also control the external transistors 215 via gate controllers 62, 63 and 64. The connections from the driver 61 to the gate controllers 62, 63 and 64 are not shown for reasons of clarity. The gate controllers 62, 63, 64 can be used to deactivate the terminals GATE1, GATE2 and GATE3, in particular optionally, or to optionally control the external transistors 215A, 215B, 215C.

In addition, the driver circuit 16 comprises an availability checking circuit 65, which is configured to check which of the external transistors 215 are available, i.e. connected to the respective terminal GATE1, GATE2, GATE3 and operable, for example, not defective.

For this purpose, the availability check 65 is connected both to each of the terminals GATE1, GATE2, GATE3 as shown and to the terminal OUT via a resistor 66. By means of the connection to the terminals GATE1, GATE2, GATE3, the availability checking circuit 65 "knows", which of the external transistors 215 should be switched on. For example, to check the availability the driver 61 can activate the gate controllers 62, 63, 64 sequentially to switch on the respective transistors 215A, 215B, 215C. The resistor 66 can then be used to detect whether this switching-on causes a corresponding voltage change at the terminal OUT. If this is the case, the respective transistor is available.

Such checking can be performed both when starting up the driver circuit 60 and during its operation, for example in phases in which the load 218 does not require a supply of electrical power.

Figure 7:
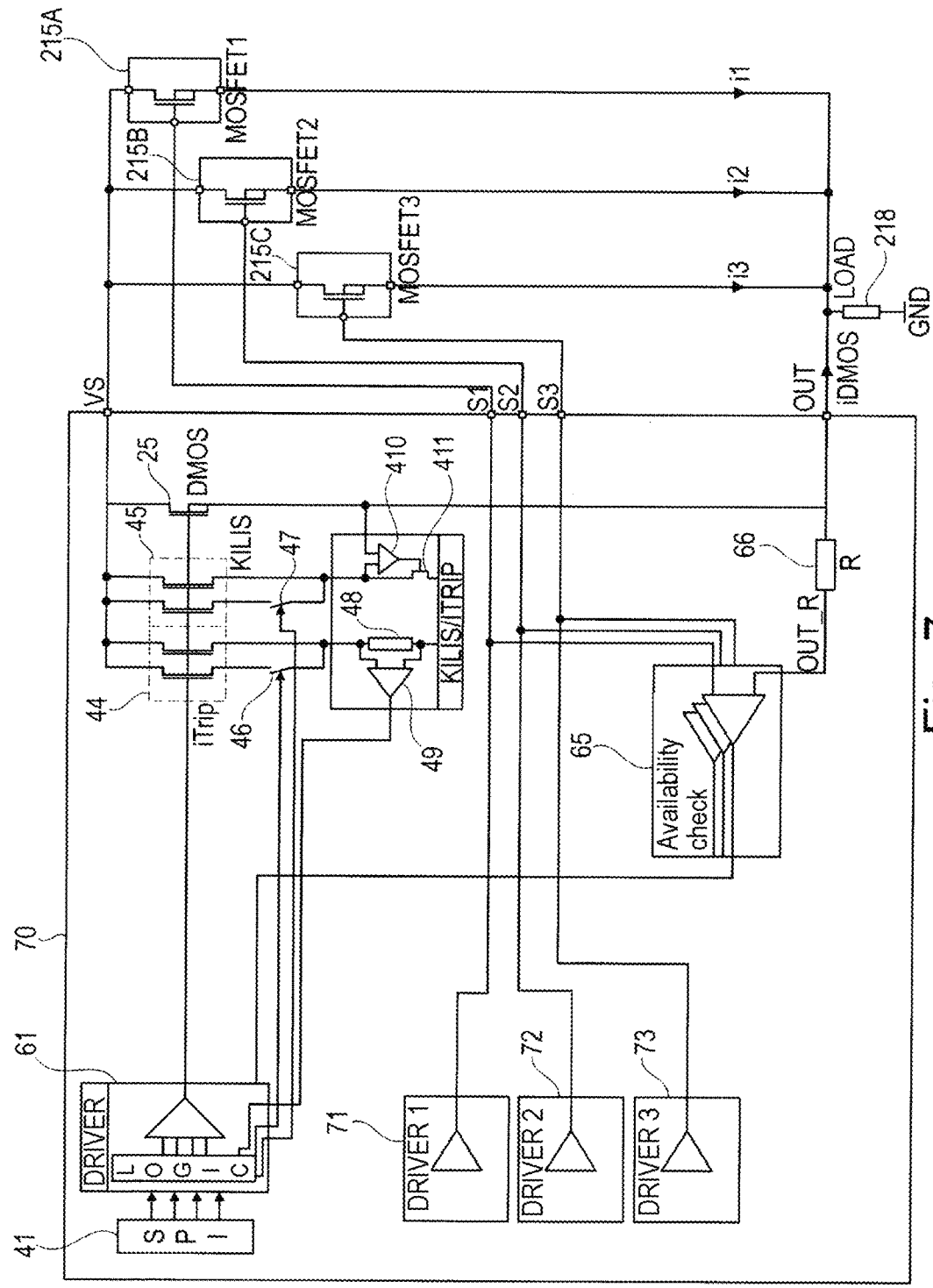
FIG. 7 shows a circuit diagram of a system in accordance with one exemplary embodiment.

FIG. 7 shows another exemplary embodiment of a system, which represents a variation of the system of FIG. 6.

The system of FIG. 7 has a driver circuit 70. In contrast to the driver circuit 60 of FIG. 6, the driver circuit 70 has a separate gate driver 71, 72, 73 for each terminal GATE1, GATE2, GATE3. These separate gate drivers can be controlled by the logic of the gate driver 61 or else directly by a microcontroller via the interface 41. In operation, the gate driver 61 and the gate drivers 71 to 73 are controlled in such a way that the power transistor 25 and the external transistors 215 are controlled in a mutually corresponding manner, as has already been explained. If the availability checking circuit 65 indicates that one or more of the external transistors 215 are not available, the corresponding gate driver or drivers 71, 72, 73 is/are deactivated, so that the corresponding output GATE1, GATE2 or GATE3 is deactivated.

Figure 8:
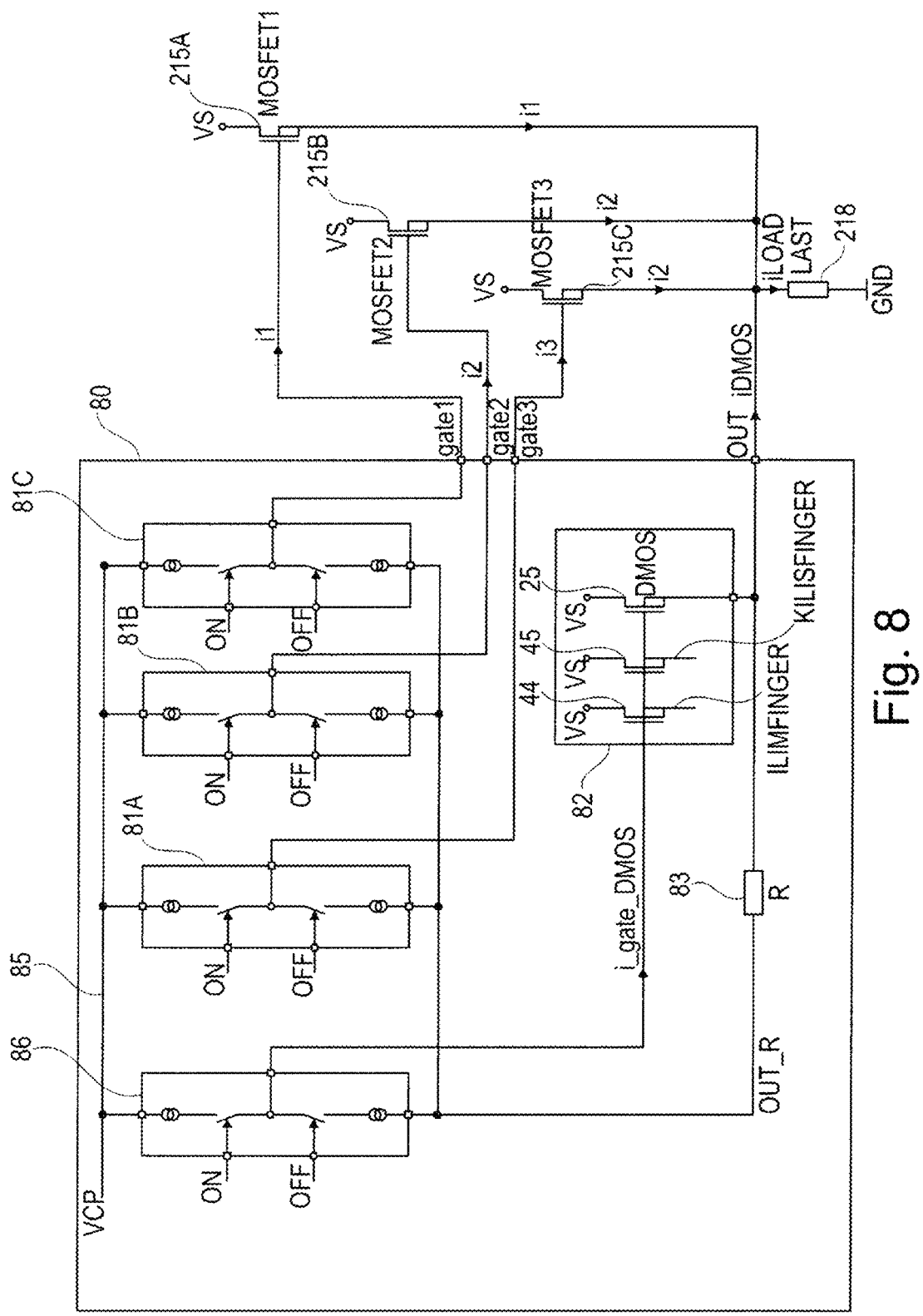
FIG. 8 shows a circuit diagram of a system in accordance with one exemplary embodiment.

An implementation example for such gate drivers is shown in FIG. 8. FIG. 8 shows a system with a part of a driver circuit 80, to which, as an example, three external transistors 215 are again connected at respective terminals GATE1, GATE2 and GATE3. Other parts of the driver circuit 80 may be implemented as in the exemplary embodiments described above.

In a block 82, the driver circuit 80 has the power transistor 25 already discussed with the sensing transistor arrangements 44 and 45. The power transistor 25 and the sensing transistor arrangements 44, 45 are controlled by a first driver 86. As shown, the first driver 86 essentially has a high-side switch and a low-side switch, which can be used to connect an output node of the driver to either a high-side current source or a low-side current source. The first driver is then connected between a supply voltage VCP 85, supplied by a charge pump, and—via a resistor 83—the output OUT.

To drive the external transistors 215A, 215B, 215C, corresponding second drivers 81A, 81B and 81C are provided, which are set up in the same way as the first driver 86. To switch on the power transistor 25 and the external transistors 215, the first driver 86 and the second drivers 81A to 81C are activated with a signal ON to close the high-side switches while the low-side switches are open. To switch off the transistors, the drivers 86, 81A, 81B and 81C are activated accordingly with a signal OFF to close the low-side switches while the high-side switches are open. In some exemplary embodiments this control is carried out for all drivers 86, 81A, 81B, 81C together, so that the transistors can be controlled in a mutually corresponding manner. If an availability check is provided as described above, those of the drivers 81A to 81C at which the associated terminal GATE1 to GATE2 has no external transistor 215 available can be deactivated, for example by opening both high-side switches and low-side switches.

Figure 9:
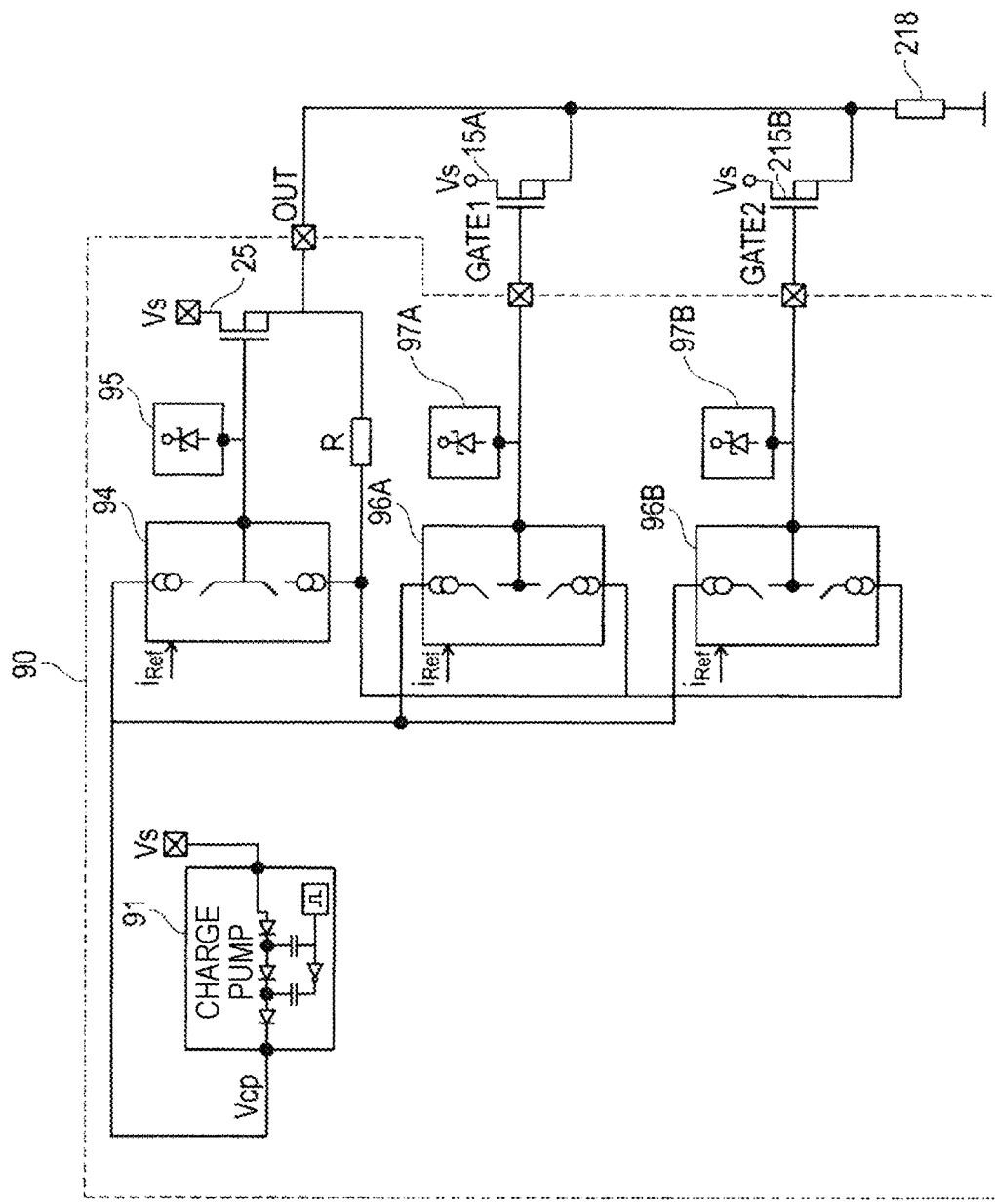
FIG. 9 shows a circuit diagram of a system in accordance with one exemplary embodiment.

A further system is illustrated in FIG. 9. The system of FIG. 9 has a driver circuit 90 with the power transistor 25 as already discussed, which is connected at two terminals GATE1, GATE2, as an example, to two external transistors 215A, 215B. Again, the number two of the external transistors is purely an example.

Other parts of the driver circuit 90, in particular for current sensing, can be implemented as described in the previous exemplary embodiments. FIG. 9 is mainly intended to provide another example of the implementation of gate drivers.

The driver circuit 90 has a charge pump 91 which supplies a voltage for all the gate drivers described below. In the example shown, the charge pump 91 is a Dickson charge pump. Other types of charge pumps can also be used.

A driver circuit 94 is provided for controlling the power transistor 25, and driver circuits 96A, 96B are provided for controlling the external transistors 215A, 215B. Like the 86, 81A to 81C driver circuits discussed with reference to FIG. 8, the driver circuits 94, 96A, 96B have a high-side switch, a low-side switch, a high-side current source and a low-side current source. In some exemplary embodiments, as already discussed by reference to FIG. 8, the high-side switches and the low-side switches of the driver circuits are controlled by common control signals (ON and OFF of FIG. 8), so that the power transistor 25 and the external transistors 215 are controlled in a mutually corresponding manner. At least the high-side current sources of the driver circuits 94, 96A and 96B are then controlled to supply equal currents or currents that are in a specified ratio to each other. This is realized in FIG. 9 by the fact that all driver circuits 94, 96A, 96B are supplied with the same reference current iRef, on the basis of which the current sources are regulated. The reference current iRef can be generated by a reference current source. In other exemplary embodiments, the current of the high-side current source of one of the driver circuits (e.g., the driver circuit 94) can be fed to the other driver circuits (e.g., 96A, 96B) by means of a current mirror as a reference current.

In addition, the driver 94 is assigned a clamping device 95, and the drivers 96A, 96B are assigned corresponding clamping devices 97A, 97B. Like the clamping device 214, which was already explained with reference to FIG. 2B, these clamping devices serve to limit a drain-source voltage of the respective transistor to a maximum value in order to prevent avalanche breakdown. They can be implemented using a Zener diode as for the clamping device 214. In contrast to FIG. 2B, in FIG. 9 a separate clamping device is provided for each transistor (power transistor 25 and external transistors 215).

Figure 10:
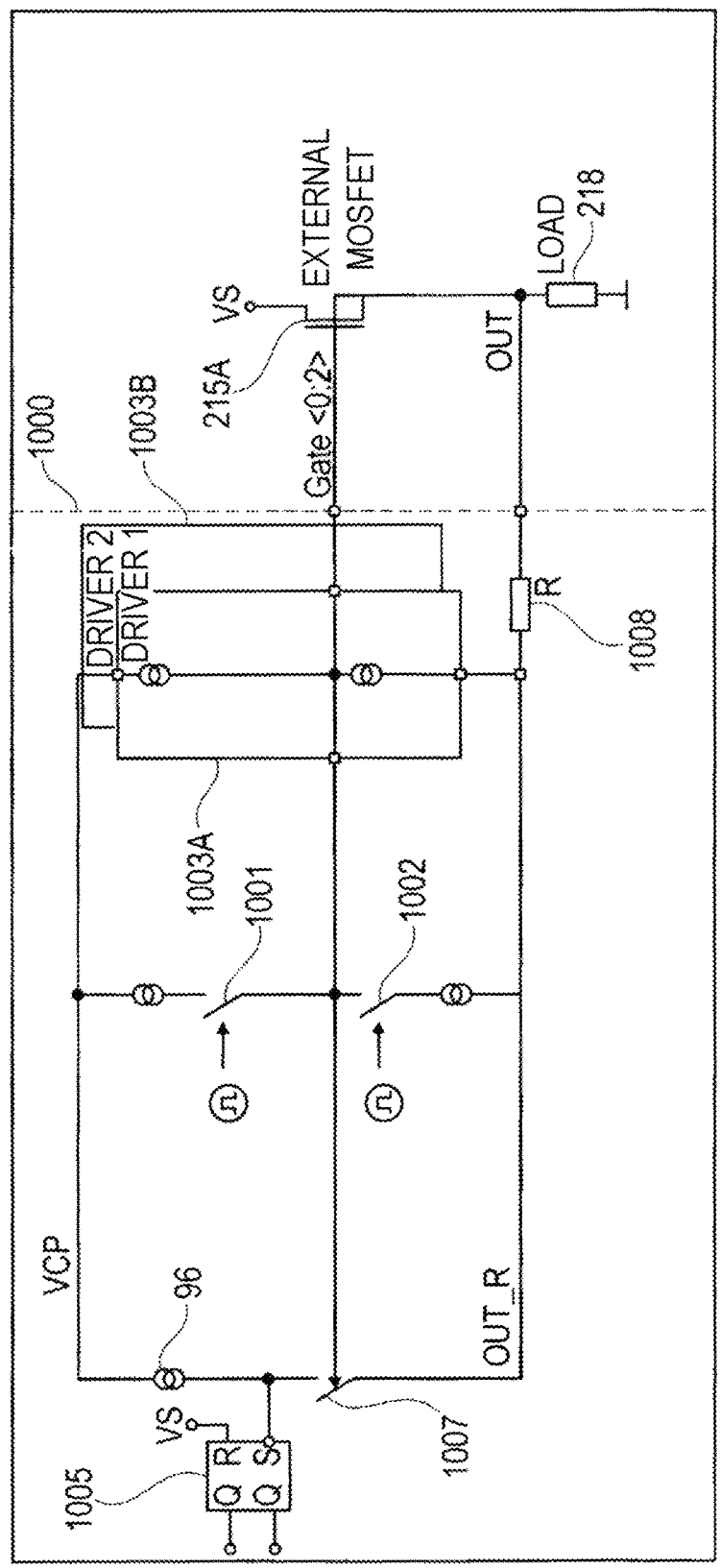
FIG. 10 shows a circuit diagram illustrating a detection of a connected transistor according to some of the exemplary embodiments.

FIG. 10 shows a more detailed exemplary embodiment of an availability checking circuit, as used in different exemplary embodiments. This circuit is explained using the example of an external transistor 215, which is controlled with a driver 1003A. Other drivers, as indicated by 1003B, may be present for additional external transistors.

The circuit of FIG. 10 is based on the fact that when monitoring charging of the transistor the gate-source voltage (or the gate voltage) should rise to the Miller plateau of the external transistor 215, in the example of FIG. 10 a MOSFET. Without the availability of the external transistor 215, it is possible to draw the gate-source voltage or gate voltage to 0 V with a current source.

For the availability check, high-side switches 1001 or low-side switches 1002 connected to corresponding current sources, which can be switched with a frequency in the range of 1 kHz, for example, are provided in order to try to pull down the gate-source voltage. This can occur, for example, in a state in which the external transistor 215 is switched on by the driver 1003A. If the external transistor 2015 is available and the gate is fully charged, it is virtually impossible to pull the gate voltage towards 0 V at this frequency, i.e. the gate voltage changes only slightly, for example in the range of 100 mV. However, if the external transistor 215 is not available, for example not connected or defective, it is possible to reduce the voltage to around 0 V. This can be detected with a comparator.

The drivers 1003A, 1003B are supplied by a charge pump 96. For example, a set-reset flip-flop 1005 with a pre-held Schmitt trigger can be used as a comparator, which is connected to the output OUT via a switch 1007, optionally via a resistor 1008.

As explained above, depending on the availability, an overcurrent threshold can be set, or a driver power can be set accordingly.

As already explained with reference to FIG. 5B, for exemplary embodiments in which the parameters of the external transistors are dissimilar to the parameters of the power transistor of the driver circuit, calibration data can be stored in a calibration memory. A corresponding method for this will now be explained with reference to FIG. 11.

Figure 11:
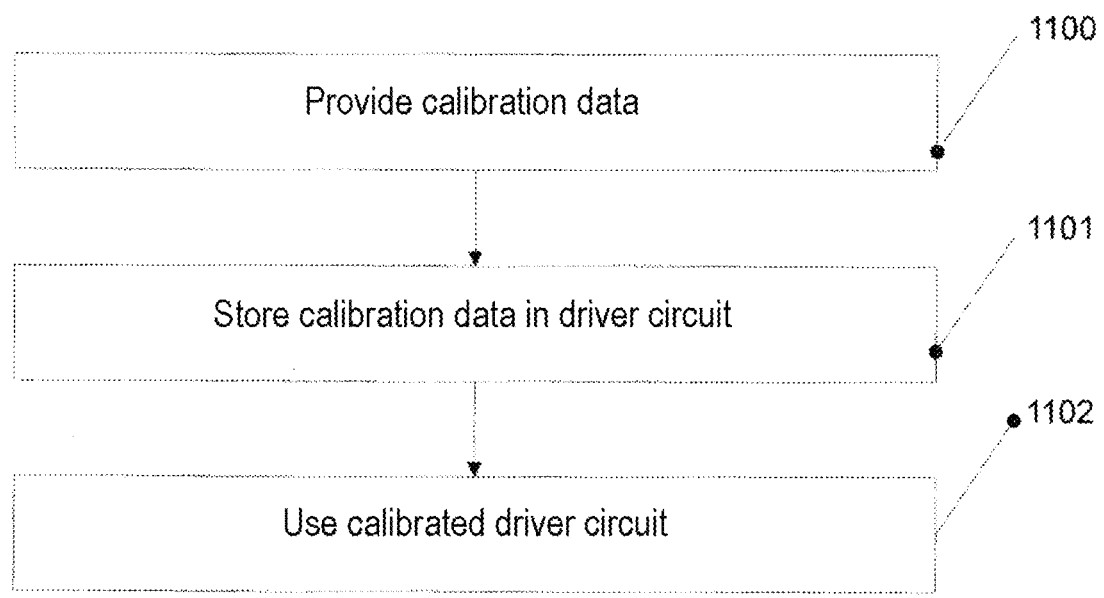
FIG. 11 shows a flowchart illustrating methods in accordance with various exemplary embodiments.

At 1100, the method of FIG. 11 comprises providing calibration data. This provision can be made by a manufacturer of the corresponding driver circuit (cf. the driver circuits described above), if this manufacturer also supplies specific transistors as external transistors for the driver circuit. However, it can also be carried out by a manufacturer of a system (systems with driver circuit and external transistors), which combines, for example, external transistors from one manufacturer with the driver circuit from another manufacturer, to produce a system. The calibration data can then include parameters of the external transistors, such as resistance in the on state Ron, breakdown voltage, overcurrent source, cutoff and the like, or a ratio of these parameters to the parameters of the power transistor (e.g., 25) of the driver circuit. These parameters can be supplied by a manufacturer of the external transistors. They can also be determined periodically during operation by means of appropriate measurements, for example at predetermined time intervals, in order to adapt the calibration to any aging of the external transistors.

At 1101, the method comprises storing the calibration data in the driver circuit.

At 1102, the calibration data is then used in the operation of the driver circuit in order, as already briefly described by reference to FIG. 5B on the basis of the calibration data from current measurements, which are performed on the basis of a current through a power transistor of the driver circuit, to be able to derive information about currents through external transistors and/or to provide an overcurrent monitoring for the external transistors using the calibration data.

Some exemplary embodiments are defined by the following examples:

Example 1. A driver circuit, comprising:
  a gate driver circuit arrangement,
  a power transistor coupled with the gate driver circuit arrangement, and
  at least one terminal coupled with the gate driver circuit arrangement,
  wherein the gate driver circuit arrangement is configured to control the power transistor and at least one transistor, coupled to the at least one terminal and external to the driver circuit, in a mutually corresponding manner,
  wherein the driver circuit is integrated in a package.

Example 2. A driver circuit according to example 1,
  further comprising a current monitoring circuit, which is configured to monitor a current through the power transistor.

Example 3. A driver circuit according to example 1 or 2, wherein the current monitoring circuit comprises a sensing transistor which is scaled with respect to the power transistor and is configured to monitor the current through the power transistor based on a current through the sensing transistor.

Example 4. The driver circuit according to example 2 or 3, further comprising a calibration memory in which information about the behavior of the at least one external transistor compared to the power transistor is stored, the current monitoring circuit being configured to monitor a current flow through the at least one external transistor on the basis of the current through the power transistor and the information.

Example 5. The driver circuit according to any one of the examples 2 to 4, wherein the driver circuit is configured to switch off the power transistor and the at least one external transistor when the current through the power transistor indicates an overcurrent event.

Example 6. The driver circuit according to any one of the examples 1 to 5, wherein the at least one terminal can be optionally deactivated.

Example 7. The driver circuit according to example 6, wherein the at least one terminal comprises a plurality of terminals, wherein each of the plurality of terminals can be optionally deactivated.

Example 8. The driver circuit according to example 6 or 7, further comprising an availability check which is configured to detect whether an external transistor is available on the at least one terminal, and optionally to deactivate the at least one terminal depending on the detection.

Example 9. The driver circuit according to any one of examples 1 to 8, wherein the gate driver circuit arrangement has a single gate driver for controlling the power transistor and the at least one external transistor.

Example 10. The driver circuit according to any one of examples 1 to 8, wherein the gate driver circuit arrangement has a first gate driver for controlling the power transistor and at least one second gate driver for controlling the at least one external transistor.

Example 11. The driver circuit according to example 10 and any one of examples 6 to 8, wherein the optional deactivation comprises optional deactivation of the at least one second gate driver assigned to the at least one terminal.

Example 12. The driver circuit according to any one of examples 1 to 11, wherein the driver circuit is monolithically integrated on a chip.

Example 13. The driver circuit according to any one of examples 1 to 11, wherein the driver circuit is integrated on two or more chips arranged in the package.

Example 14. A system, comprising:
at least one external transistor, and
a driver circuit, comprising:
a gate driver circuit arrangement,
a power transistor coupled with the gate driver circuit arrangement, and
at least one terminal coupled with the gate driver circuit arrangement,
wherein the driver circuit is integrated in a package,
wherein the at least one external transistor is coupled with the at least one terminal, and
wherein the gate driver circuit arrangement is configured to control the power transistor and the at least one external transistor a mutually corresponding manner.

Example 15. The system according to example 14, wherein the driver circuit is designed according to one of the examples 1 to 13.

Example 16. The system according to example 14 or 15, wherein the driver circuit comprises a current monitoring circuit, which is configured to monitor a current through the power transistor.

Example 17. The system according to example 16, wherein the current monitoring circuit comprises a sensing transistor, which is scaled with respect to the power transistor and configured to monitor the current through the power transistor based on a current through the sensing transistor.

Example 18. The system according to example 16 or 17, the driver circuit further comprising a calibration memory, in which information about the behavior of the at least one external transistor compared to the power transistor is stored, wherein the current monitoring circuit is configured to monitor a current flow through the at least one external transistor on the basis of the current through the power transistor and the information.

Example 19. The system according to any one of the examples 16 to 18, wherein the driver circuit is configured to switch off the power transistor and the at least one external transistor when the current through the power transistor indicates an overcurrent event.

Example 20. The system according to any one of examples 14 to 19, wherein the at least one terminal can be optionally deactivated.

Example 21. The system according to example 20, wherein the at least one terminal comprises a plurality of terminals, wherein each of the plurality of terminals can be optionally deactivated.

Example 22. The system according to example 20 or 21, wherein the driver circuit further comprises an availability check which is configured to detect whether an external transistor with the at least one terminal is available, and optionally to deactivate the at least one terminal depending on the detection.

Example 23. The system according to any one of the examples 14 to 22, wherein the gate driver circuit arrangement has a single gate driver for controlling the power transistor and the at least one external transistor.

Example 24. The system according to any one of the examples 14 to 23, wherein the gate driver circuit arrangement has a first gate driver for driving the power transistor and at least one second gate driver for controlling the at least one external transistor.

Example 25. The system according to example 24 and any one of the examples 20 to 22, wherein the optional deactivation comprises optional deactivation of the at least one second gate driver assigned to the at least one terminal.

Example 26. The system according to any one of the examples 14 to 25, wherein the driver circuit is monolithically integrated on a chip.

Example 27. The system according to any one of the examples 14 to 25, wherein the driver circuit is integrated on two or more chips arranged in the package.

Example 28. The system according to any one of the examples 14 to 27, wherein the at least one external transistor and the power transistor have similar parameters.

Example 29. The system according to example 28, wherein the parameters include one or more of the following parameters:
a resistance of the at least one external transistor when switched on,
a cutoff voltage of the at least one external transistor,
a breakdown voltage of the at least one external transistor,
a gradient of the characteristic curve of the at least one external transistor,
a type of the at least one external transistor or
an overcurrent resistance of the at least one external transistor.

Example 30. The system according to any one of the examples 14 to 29, wherein the at least one external transistor comprises a plurality of external transistors and the at least one terminal comprises a single terminal coupled with the plurality of transistors.

Example 31. The system according to any one of examples 14 to 29, wherein the at least one transistor comprises a plurality of external transistors and wherein the at least one terminal comprises a plurality of terminals, each terminal of the plurality of terminals being coupled with one transistor of the plurality of transistors.

Example 32. A method for calibrating a driver circuit, wherein the driver circuit comprises:
- a gate driver circuit arrangement,
- a power transistor coupled with the gate driver circuit arrangement, and
- at least one terminal coupled with the gate driver circuit arrangement, and
- a calibration memory;
- wherein the driver circuit is integrated in a package, and
- wherein the gate driver circuit arrangement is configured to control the power transistor and at least one transistor, coupled to the at least one terminal and external to the driver circuit, in a mutually corresponding manner, the method comprising:
- providing calibration data for the at least one external transistor, and
- storing the calibration data in the calibration memory.

Example 33. The method according to example 32, wherein the method is carried out during one or more of the following:
- during manufacturing of the driver circuit,
- during manufacturing of a system comprising the driver circuit, or
- repeatedly during a service lifetime of the driver circuit.

Example 34. The method according to example 32 or 33, wherein the calibration data are based on one or more of the following parameters:
- a resistance of the at least one external transistor when switched on,
- a cutoff voltage of the at least one external transistor,
- a breakdown voltage of the at least one external transistor,
- a gradient of the characteristic curve of the at least one external transistor, or
- an overcurrent resistance of the at least one external transistor.

Example 35. The method according to any one of examples 32 to 34, wherein the driver circuit is designed according to any one of the examples 1 to 13 and/or the driver circuit of the system is according to any one of the examples 1 to 31.

Although specific exemplary embodiments have been illustrated and described in this description, persons with current knowledge of the art will recognize that a plurality of alternative and/or equivalent implementations can be chosen as a substitute for the specific exemplary embodiments shown and described in this description, without deviating from the scope of the invention disclosed. It is the intention that this application covers all adaptations or variations of the specific exemplary embodiments discussed here. It is therefore intended that this disclosure is limited only by the claims and their equivalents.

What is claimed is:

1. A driver circuit, comprising:
a gate driver circuit arrangement,
a power transistor coupled with the gate driver circuit arrangement, and
at least one terminal coupled with the gate driver circuit arrangement,
wherein the gate driver circuit arrangement is configured to control the power transistor and at least one external transistor coupled to the at least one terminal and external to the driver circuit in a mutually corresponding manner,
wherein a drain-source path of the at least one external transistor is configured to be coupled in parallel with a drain-source path of the power transistor,
wherein the gate driver circuit arrangement and the power transistor are integrated in a package and the at least one external transistor is external to the package.

2. The driver circuit as claimed in claim 1, further comprising a current monitoring circuit configured to monitor a current through the power transistor.

3. The driver circuit as claimed in claim 2, wherein the current monitoring circuit comprises a sensing transistor which is scaled with respect to the power transistor and is configured to monitor the current through the power transistor based on a current through the sensing transistor.

4. The driver circuit as claimed in claim 2, further comprising a calibration memory in which information about a behavior of the at least one external transistor compared to the power transistor is stored, wherein the current monitoring circuit is configured to monitor a current flow through the at least one external transistor on based on the current through the power transistor and the information stored in the calibration memory.

5. The driver circuit as claimed in claim 2, wherein the driver circuit is configured to turn off the power transistor and the at least one external transistor when the current through the power transistor indicates an overcurrent event.

6. The driver circuit as claimed in claim 1, wherein the at least one terminal is configured to be selectively deactivated.

7. The driver circuit as claimed in claim 6, wherein the at least one terminal comprises a plurality of terminals, wherein each of the plurality of terminals is configured to be selectively deactivated.

8. The driver circuit as claimed in claim 6, further comprising an availability checking circuit configured to detect whether an external transistor is available at the at least one terminal and to deactivate the at least one terminal depending on the detection.

9. The driver circuit as claimed in claim 1, wherein the gate driver circuit arrangement has a single gate driver for controlling the power transistor and the at least one external transistor.

10. The driver circuit as claimed in claim 1, wherein the gate driver circuit arrangement has a first gate driver for controlling the power transistor and at least one second gate driver for controlling the at least one external transistor.

11. The driver circuit as claimed in claim 10, wherein the at least one terminal is configured to be selectively deactivated by selectively deactivating the at least one second gate driver assigned to the at least one terminal.

12. The driver circuit as claimed in claim 1, wherein the driver circuit is monolithically integrated on a chip, or wherein the driver circuit is integrated on two or more chips arranged in the package.

13. The driver circuit as claimed in claim 1, wherein the gate driver circuit arrangement is configured to control the power transistor and the at least one external transistor to be switched on and off simultaneously in the mutually corresponding manner.

14. A system, comprising:
at least one external transistor; and
a driver circuit, comprising:
a gate driver circuit arrangement,
a power transistor coupled with the gate driver circuit arrangement, and
at least one terminal coupled with the gate driver circuit arrangement and with the at least one external transistor,
wherein a drain-source path of the at least one external transistor is configured to be coupled in parallel with a drain-source path of the power transistor, wherein the driver circuit is integrated in a package, and the at least one external transistor is external to the package, and wherein the gate driver circuit arrangement is configured to control the power transistor and the at least one external transistor in a mutually corresponding manner.

15. The system as claimed in claim 14, wherein the at least one external transistor and the power transistor have at least one similar parameter.

16. The system as claimed in claim 15, wherein the at least one similar parameter comprises at least one or more of the following parameters:
an on resistance,
a cutoff voltage,
a breakdown voltage,
a gradient of a characteristic curve,
a transistor type, or
an overcurrent resistance.

17. The system as claimed in claim 14, wherein the at least one external transistor comprises a plurality of external transistors and wherein the at least one terminal comprises a single terminal coupled to the plurality of external transistors; or
wherein the at least one external transistor comprises the plurality of external transistors, and wherein the at least one terminal comprises a plurality of terminals, and wherein each terminal of the plurality of terminals is coupled with one transistor of the plurality of external transistors.

18. A method for calibrating a driver circuit comprising a gate driver circuit arrangement, a power transistor coupled with the gate driver circuit arrangement, at least one terminal coupled with the gate driver circuit arrangement, and a calibration memory, wherein the gate driver circuit arrangement and the power transistor are integrated in a package, wherein the gate driver circuit arrangement is configured to control the power transistor and at least one external transistor external to the package coupled to the at least one terminal and external to the driver circuit in a mutually corresponding manner, and wherein a drain-source path of the at least one external transistor is configured to be coupled in parallel with a drain-source path of the power transistor, the method comprising:
providing calibration data for the at least one external transistor, and
storing the calibration data in the calibration memory.

19. The method as claimed in claim 18, wherein the method is carried out during manufacturing of the driver circuit, during manufacturing of a system comprising the driver circuit, or repeatedly during a service lifetime of the driver circuit.

20. The method as claimed in claim 18, wherein the calibration data are based on one or more of the following parameters:
a resistance of the at least one external transistor when switched on,
a cutoff voltage of the at least one external transistor,
a breakdown voltage of the at least one external transistor,
a gradient of a characteristic curve of the at least one external transistor, or
an overcurrent resistance of the at least one external transistor.

* * * * *